DOUBLE TUNED INPUT AND FIXED INTERSTAGE VHF TUNER

Filed March 14, 1968 3 Sheets-Sheet 1

INVENTORS:
EUGENE K. Von FANGE
SANJAR GHAEM-maghami
BY [signature]
THEIR ATTORNEY.

DOUBLE TUNED INPUT AND FIXED INTERSTAGE VHF TUNER

Filed March 14, 1968 3 Sheets-Sheet 2

INVENTORS:
EUGENE K. Von FANGE
SANJAR GHAEM-maghami
BY [signature]
THEIR ATTORNEY.

DOUBLE TUNED INPUT AND FIXED INTERSTAGE VHF TUNER

Filed March 14, 1968 3 Sheets-Sheet 3

INVENTORS:
EUGENE K. Von FANGE
SANJAR GHAEM-maghami
BY Francis ... Jr.
THEIR ATTORNEY.

United States Patent Office 3,562,652
Patented Feb. 9, 1971

3,562,652

DOUBLE TUNED INPUT AND FIXED INTERSTAGE VHF TUNER

Eugene K. Von Fange and Sanjar Ghaem-maghami, Chesapeake, Va., assignors to General Electric Company, a corporation of New York Filed Mar. 14, 1968, Ser. No. 713,236
Int. Cl. H03j *3/20, 5/24;* H04b *1/16*
U.S. Cl. 325—459 9 Claims

ABSTRACT OF THE DISCLOSURE

A VHF tuner for a VHF–UHF television receiver comprising three wafers mounted on a printed circuit board, each of the wafers carrying a printed conductive pattern. Two of the wafers couple an RF input section to the RF amplifier stage to double tune the input of the VHF tuner. A third of the wafers is coupled to the oscillator stage. Rotatably mounted contact means are associated with each of the wafers to engage the printed conductive pattern in 12 different VHF contact positions and 1 UHF contact position.

BACKGROUND OF THE INVENTION

This invention relates to a tuning means, and more particularly, this invention relates to a VHF tuning means.

Generally speaking, a VHF tuner for today's television receivers comprises an RF input section, an RF amplifier stage, a mixer stage, and an oscillator stage. The actual tuning is achieved by placing a variable impedance tuning element between the RF input section and the RF amplifier stage in order to provide a tunable input and placing a variable impedance tuning element between the RF amplifier stage and the mixer stage in order to provide a tunable interstage. This type of tuner has generally come to be known as a tuned input and tuned interstage tuner for obvious reasons.

To those skilled in the art, it will be appreciated that the above-described tuner does have certain electronic drawbacks. In general, any tuner must satisfy certain noise figure requirements and gain bandwidth-product requirements. In addition, the tuner must prevent the feeding back of oscillator stage signals to the RF input section and must achieve neutralization of any transistors. While the above-described tuner can satisfactorily achieve all of the above requirements, certain of the characteristics must be compromised for others thereby preventing an optimum performance. In other words, the prior art has lacked a flexibility in achieving the optimum for each of the requirements.

Yet, the prior art tuners have been mechanically sound and generally adaptable to the physical requirements of today's television receivers. In particular, the prior art tuners have lent themselves to either switch or turret construction. Furthermore, the prior art tuners have generally lent themselves to a UHF–VHF environment as required by the Federal Communications Commission.

SUMMARY OF THE INVENTION

In view of the foregoing, it is a first object of this invention to achieve a VHF tuner sufficiently flexible to concurrently satisfy all electronic requirements.

It is a second object of this invention to achieve a tuner which is mechanically adaptable to today's television receivers.

It is a third object of this invention to achieve a tuner meeting the aforementioned objective at an improved cost.

In one embodiment of the invention consistent with the first objective, there is provided a pair of variable impedance tuning elements coupled between an RF input stage and an RF amplifier stage while a fixed impedance means couples the RF amplifier stage to the mixer stage. Additional tuning means are associated with the oscillator stage which feeds the mixer stage. Consistent with the second and third objectives, each of the tuning elements comprises a wafer with rotatable contact means engaging a planar conductive pattern on only one side of the wafer's dielectric member.

BRIEF DESCRIPTION OF THE DRAWINGS

This specification concludes with claims particularly pointing out and distinctly claiming the subject matter which is regarded as the invention. The invention may also be understood from the following description taken in connection with the accompanying drawings in which:

FIG. 1 is a block diagram of a double tuned input and fixed interstage VHF tuner. As shown there, the tuner comprises an RF input section 16 which is coupled to an RF amplifier stage 17 through a double tuned coupling means comprising a pair of variable impedance tuning elements 2 and 3. While a further description of the double tuned coupling means is set forth below, it should be pointed out that the term "double tuned coupling means" as used herein indicates a pair of tuneable, variable—reactance elements which are electromagnetically or electrostatically coupled. The tuner further comprises a mixer stage 19 coupled to the RF amplifier stage output through a fixed interstage impedance coupling network 5. In addition, the tuner comprises an oscillator stage 18, tuned by a variable impedance tuning element 6, coupled to the mixer stage 19.

The above-described circuit is able to meet the electronic requirements in the following ways. First, the double tuned input avoids the difficult impedance matching problems between the input impedance $R_{in}$ and the output impedance $R_{out}$ of the amplifier stage 17. As a consequence, the noise figure requirement is more easily met. In fact, if $R_{in}$ and $R_{out}$ are allowed to be sufficiently mismatched so that $R_{in}<R_{out}$, neutralizing of an RF amplifier stage may be achieved without additional circuitry. Also, the fact that the tuner is double tuned, though tuned in the input only, allows the tuner to attain an optimum gain-bandwidth product and sufficient isolation of the RF input from the oscillator stage 18 without sacrificing the noise figure requirement.

Figure 1:
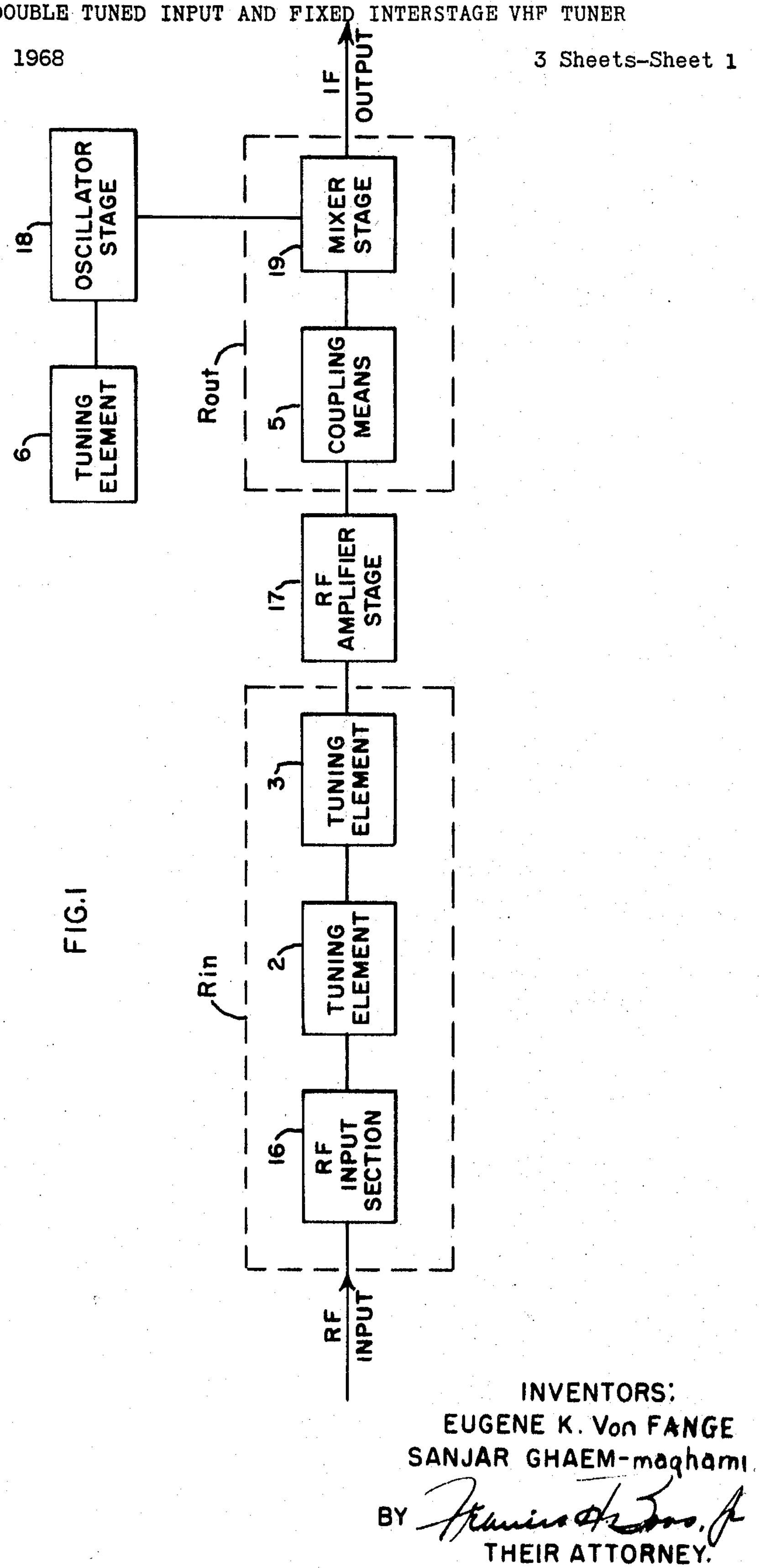
FIG. 1 is a block diagram of a tuner incorporating the invention.
Figure 2:
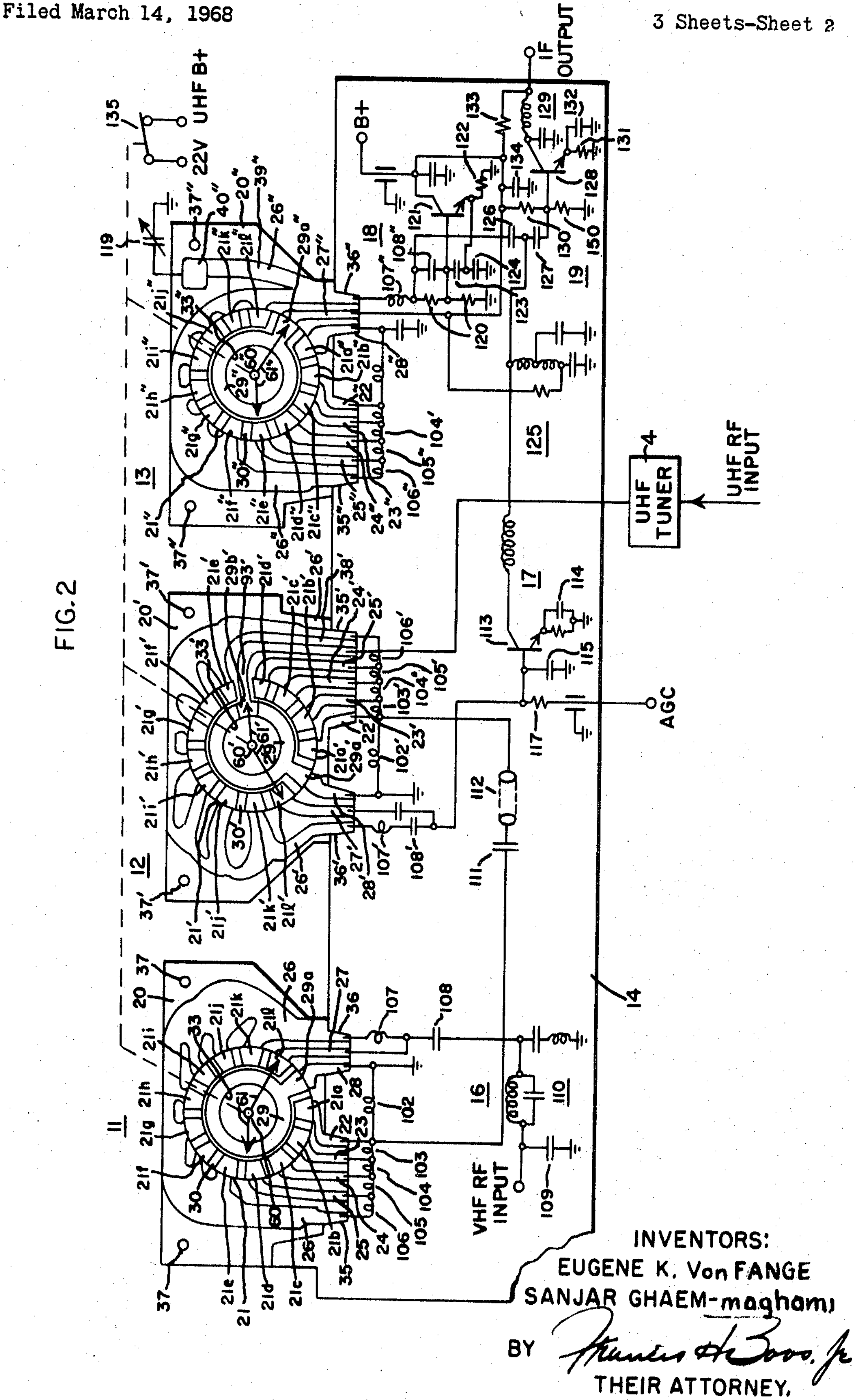
FIG. 2 is a hybrid schematic-elevation view of the tuner circuit and assembly.

In order to achieve a double tuned input and fixed interstage tuner at an improved cost, the switch tuner construction of FIG. 2 has been used as shown there, the input section 16, the RF amplifier stage 17, the oscillator stage 18, and the mixer stage 19 have been applied to a support means in the form of a printed circuit board 14. Also, the double tuned input tuning elements 2 and 3 comprising wafers 11 and 12 and the oscillator tuning element 6 comprising wafer 13 have been mounted on the printed circuit board 14.

In order to appreciate the function of the wafers 11, 12, and 13 as a VHF tuning means as well as a UHF tuner switch for a UHF tuner 4, the precise nature of the wafer 11, 12, and 13 must be examined. Wafer 11 comprises a dielectric member 20 carrying an outermost arcuate dielectric contact area 21 including silver plated contact elements 21(*a–l*). The plurality of contact elements 21(*a–l*) are connected at one or more points to copper planar conductive elements 22–27 which coat only one side of a dielectric member 20 to form a continuum therewith. The wafer further comprises a second arcuate or circular contact area 29 comprising a silver plated contact element **29*a* connected to a planar conductive element 28. It is very important to note that the positioning of the planar conductive elements 22–28** on only one side of the wafer permits a significant cost saving consistent with one objective of this invention, as well as facilitating the electromagnetic coupling between corresponding elements of the double-tuned coupling means disposed on adjacent wafers. Further, the planar configuration of the conductive elements results in a substantially 2-dimensional element which facilitates placement of adjacent wafers so as to obtain consistent electromagnetic coupling therebetween. In addition, the absence of conductive elements on the opposite side of the wafer eliminates the shielding affect caused by the presence of such elements.

In the above-described configuration, the silver plated contact element **29*a* corresponds with the channel 2 position while contact elements 21**(*a–k*) correspond to channels 3 through 13 in the VHF frequency band. Consequently, rotation of a rotor contact means 61 may variably connect the planar conductive elements 22–26 and 28 in each of a plurality of positions so as to tune the RF input section 16.

The UHF switch function of the wafer 11 is performed by rotating the contact 61 so as to engage the additional contact element 21(*l*) in the channel one position. At this position, the RF input section 16 will be disabled and the RF input signal will be grounded through the additional planar conductive element 27, the additional contact element 21(*l*), contact element 29, and planar conductive element 28.

In order to facilitate the connection of the RF input to the wafer 11 and the connection of the wafer 11 to ground, the planar conductive elements 22–28 are positioned outside the circular contact area 21 so as to achieve a printed-circuit-to-printed-circuit interface between the wafer 11 and the board 14. Since the conductive elements 22–28 radiate geometrically toward the edges of the dielectric member 20, the planar conductive elements 26 and 27 may be readily and fixedly connected to the RF input while the planar conductive element 28 may be readily and fixedly connected to ground on the printed circuit board 14. Furthermore, the planar conductive elements 22–28 may be fixedly connected to a variety of electronic components on the circuit board 14 including discrete tuning inductors 102, 103, 104, 105, 106, and 107, and the RF input section 16 including discrete tuning capacitors 108, 109, and an IF filter 110.

Figure 3:
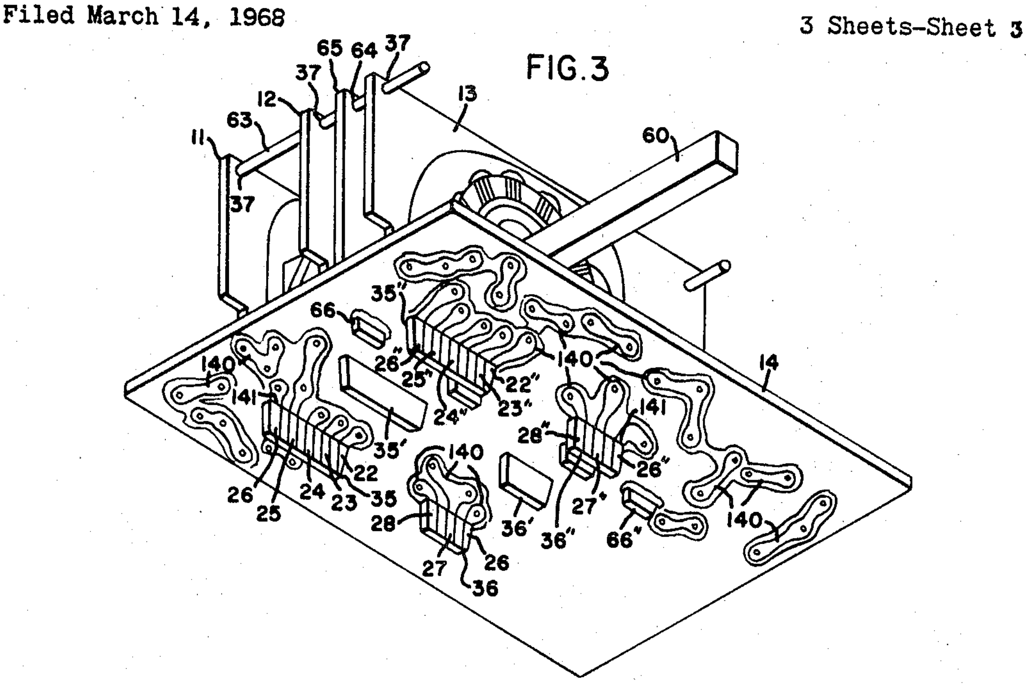
FIG. 3 is a perspective view above the switch tuner assembly.
Figure 4:
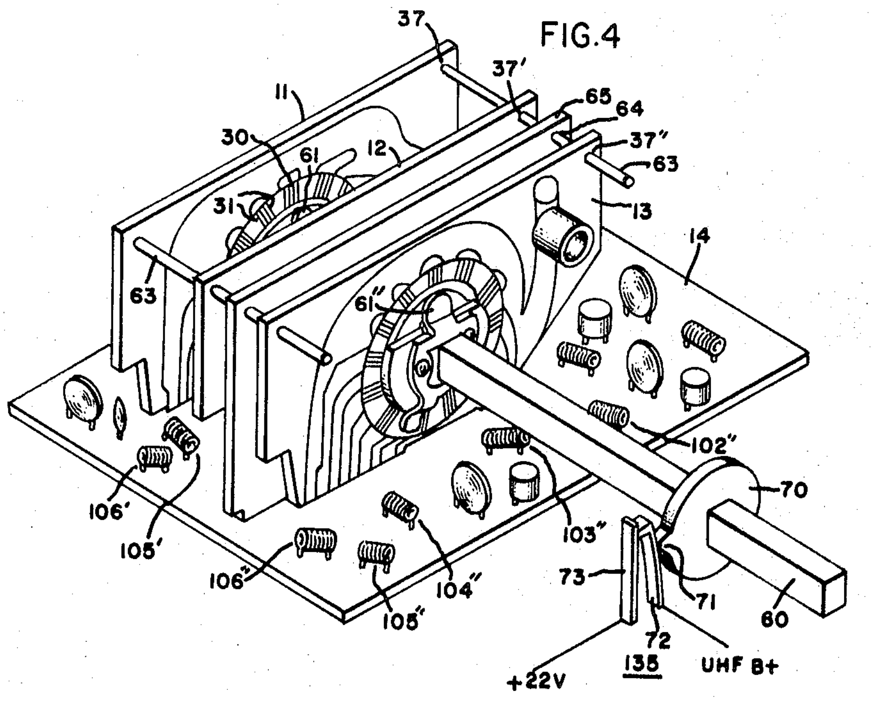
FIG. 4 is a perspective view below the switch tuner assembly of FIG. 3.

The wafer 11 also includes a number of features which adapt it for use in an assembly as more clearly shown in FIGS. 3 and 4. One of these features is the use of silver plated isolating islands 30 positioned in voids 31 to prevent mutual coupling in the contact area 21 while coincidentally preventing contamination of the points on contact 61 by the dielectric member 20. This feature is the subject matter of copending application, Ser. No. 713,046, filed Mar. 14, 1968, assigned to the assignee of the present invention. Other features include a central aperture 33 which will receive the rotor shaft 60 carrying the contact 61, a pair of legs 35 and 36 which are inserted through the circuit board 14, and a pair of apertures 37 which receive assembly mounting rods for securing the wafer 11 in place.

The wafer 12, the second tuned element of the double tuned input, is *substantially* a mirror image of the wafer 11 for impedance matching purposes. The inductive coupling between similarly-formed elements on wafers 11 and 12 provides the electromagnetic coupling of the two portions of the double tuned coupling means for channels 7–13 and supplements the coupling between corresponding tuning elements for channels 2–6, aiding in rejecting undesirable frequencies and contributing to the desired impedance characteristics of the coupling means. Since the wafer 12 is similar to the wafer 11, elements of the wafer 12 are shown with element numbers corresponding to the element numbers of the wafer 11 primed. In addition, corresponding discrete tuning elements carried by the circuit board 14 are also primed.

However, the wafer 12 is sufficiently different from the wafer 11 so as to provide a novel switching function for the UHF tuner 4. In particular, the wafer 12 must provide the coupling function for IF signals from the UHF tuner 4 to the RF amplifier stage 17 while also performing the VHF tuning function. In order to achieve the UHF coupling function, an additional contact element **29*b*′ is provided and connected to an additional planar conductive element 38′ through a silver plated segment 93′. When the contact means 61′ is in the position shown, the UHF tuner 4 will be coupled through printed circuitry on the printed circuit board 14, the additional planar conductive element 38′, the silver plated segment 93′, the additional contact element 29*b*′, the contact means 61′, the additional contact element 21**(*l*)′, another additional planar conductive element 27′, and a coupling capacitor 9 to the RF amplifier stage 17 on the printed circuit board 14.

In performing the VHF tuning function, the wafer 12 operates substantially similarly to the wafer 11 with contact elements **29*a*′ and 21**(*a–k*)′ corresponding to tuned channel positions 2 through 13. When the contact means 61′ is moved through these positions, the amplifier stage 17 comprising a transistor 113, a parallel RC emitter combination 114, a blocking capacitor 115 and a series RC–AGC coupling combination 117 will be tuned. When the wafer 12 is operating as the VHF tuning means, the RF input section 16 will not be grounded but will pass a VHF signal to a first tuning element comprising the printed circuitry on wafer 11, and discrete inductors associated therewith. The signal is inductively coupled from the first tuning element to corresponding portions of the printed circuitry and discrete inductors connected to wafer 12, from where it is transmitted to the base terminal of transistor 113. When contact means 61 and 61′ are oriented on contacts **29*a* and 29*a*′ of wafers 11 and 12 respectively for passing signals of a frequency corresponding to channel 2, additional means are necessary to transmit the relatively low-frequency signal from wafer 11 to wafer 12. The VHF signal passes from the junction of inductors 102 and 103 through a high channel frequency absorption capacitor 111, a low channel frequency, image rejection ferrite core 112, and printed circuitry of the circuit board 14 to the junction of inductors 102′ and 103′**.

The wafer 13 is capable of yet another tuning function, the tuning of the oscillator stage 18. In the case of the wafer 13, all element numbers of the wafer 13 which correspond to element numbers of the wafer 11 are double primed. Similarly, the discrete tuning elements of the wafer 13 which correspond to similar discrete tuning elements of the wafer 11 are double primed.

Once again, the precise wafer construction is dictated by the function to be performed. In this case, the wafer 13 is designed not only for VHF tuning of the oscillator stage 18 but also serves as a UHF switch disabling the oscillator stage 18 by disconnection of the B+ power supply. The disconnection of the B+ is achieved by placing the contact means 61″ in the position shown. In this position, the B+ is disconnected from the planar conductive element 26 since the contact 61″ engages the contact element 29″ only. As a result, the base of the oscillator transistor 121 is left unbiased.

In addiiton to the UHF switching function, the wafer 13 of course serves a VHF tuning function for the transistor 121 with a series base biasing resistor combination 120 connected to the B+ through the planar conductive element 28″ when the contact means 61″ is in appropriate positons so as to engage contact elements 21(*a–l*)″ corresponding to channel 2 through 13. The oscillator stage 18 also comprises a biasing resistor 122, a feedback capacitor 123, and a leakoff capacitor 124. An additional design feature dictated by the necessity for fine tuning means is the use of a variable capacitor 119 connected to an additional planar conductive element 39″ at a contact point 40″.

In order to convert the RF output of the RF amplifier 17 to an IF signal, the output from the collector of the transistor 113 and the output from the oscillator stage 18 are coupled to the mixer stage 19. The oscillator output signal is coupled to the mixer stage 19 through coupling capacitors 126 and 127. The RF signal coupling is effected through the fixed impedance coupling network 5 which comprises a compromise matching network 125, the coupling capacitor 127, and a small resistor 150. The fixed impedance characteristic of coupling network 5 is suitable for use in the present tuner due to the substantially constant magnitude of the output of RF amplifier 17 over the VHF range, made possible by the good frequency response characteristics of the double tuned coupling means as set forth above. Since the resistive impedance of the coupling network 5 will be small because of the domination by resistor 150, the input impedance $R_{in}$ of the amplifier stage 17 will be large compared to the output impedance $R_{out}$. As a result, the the transistor 113 will be neutralized without resorting to additional circuitry. Both the RF and oscillator signals are then applied to the base of the mixer transistor 128.

In addition to the transistor 128, the mixer stage 19 also includes a biasing resistor 130 connected to the base of the transistor 128 and the B+ power supply. The bias circuitry for the transistor 128 also includes an emitter resistor 131 shunted by a by-pass capacitor 132 and a collector resistor 133 shunted by a blocking capacitor 134. The IF output of the transistor 128 is then taken at the collector through an IF tuned circuit 129. As shown in FIG. 2, the rotor contacts 61, 61′, 61″ are not only ganged to permit VHF channel selection, but they are also ganged with a UHF switch 135 to prepare the tuner assembly for reception of the UHF signals.

In the position shown in FIG. 2, the B+ supply for the VHF tuner oscillator is presently disconnected from the base of the transistor 21 due to the position of the rotor contacts 61″. As a result, the oscillator is cut off while the RF input is grounded so as to pass only the IF signal from the UHF tuner through the amplifier stage 17 to the mixer stage 19.

In order to demonstrate the ease of connecting the wafers 11, 12, and 13 to the circuit board 14, the tuner assembly is shown in FIGS. 3 and 4. In those figures, it may be seen that the plane of the printed circuit board 14 will intersect the conductive elements on the wafers 11, 12, and 13. Consequently, the printed circuits 140 which interconnect the electronic components including the discrete tuning elements 102–108, 102′–108′, and 102″–108″, and the planar conductive elements 22–28, 22′–28′ and 38′, and 22″–28″ may be soldered simultaneously. The net result is a plurality of printed-circuit-to-printed-circuit interfaces 141.

In order to maintain a certain rigidity among the interfaces 141, the legs 35, 36, 35′, 36′, 35″, 36″ are inserted through apertures in the circuit board 14. Additional support is provided by inserting rods 63 through aperture 37, 37′, and 37″. The rods 63 also pass through aperture 64 in the conductive shield 65 which is positioned between the wafers 12 and 13. Further support for the shield 65 is achieved by inserting tab 66 through apertures in the circuit board 14 and soldering the tabs in place.

The actual tuning of the assembly is effected by rotation of shaft 60 carrying the rotor contact member 61, 61′, and 61″ for each wafer 11–13. In addition to the contact member 61, 61′, and 61″, the shaft 60 carries a cam 70 with a camming surface 71. When shaft 60 is rotated to the position shown which corresponds to UHF reception or the channel 1 position, the camming surface 71 will force the switch member 72 of the switch 135 to contact a conductive member 73 maintained at a potential 22 volts. The switch 135 may be supported by means not shown but well known in the art.

Although specific embodiments of the invention have been described, it is not desired that the invention be limited to any particular form shown, and it is intended by the appended claims to cover all modifications within the spirit and scope of the invention.

What is claimed as new and desired to be secured by Letters Patent of the United States is:

1. A VHF tuner comprising:
an RF input section;
an RF amplifier stage;
a mixer stage;
double tuned coupling means including a pair of electromagnetically coupled variable impedance tuning elements for coupling said RF input section to said RF amplifier stage; and
a coupling network comprising substantially fixed impedance means for receiving signals outputted by said RF amplifier stage and transmitting said signals to said mixer stage.

2. The VHF tuner as recited in claim 1 comprising:
an oscillator stage and another variable impedance tuning element coupled to said oscillator stage.

3. The VHF tuner as recited in claim 2 wherein each of said tuning elements comprises a wafer and contact means movably mounted with respect to said wafer, said wafer including a dielectric member and a conductive pattern carried by said dielectric member, said contact means moving through a plurality of contact positions to variably engage said conductive pattern.

4. The VHF tuner as recited in claim 3 wherein said conductive pattern includes a plurality of planar conductive elements and a plurality of contact elements corresponding to a plurality of VHF contact positions, said dielectric member carrying said planar conductive elements on only one side thereof.

5. The VHF tuner as recited in claim 4 including support means, said RF input section, said RF amplifier stage, said mixer stage, said oscillator stage, and said wafers being fixedly mounted on said support means, said plurality of planar conductive elements of each of said wafers also being fixedly connected to said support means, said contact means engaging two of said contact elements in any one position in order to tune said tuning elements.

6. The VHF tuner as recited in claim 5 in combination with a UHF tuner, one of said wafers of said pair of tuning elements comprising a first and a second additional planar conductive element and a first and a second additional contact element corresponding to a UHF reception position, said first additional planar conductive element coupled to said UHF tuner and said first additional contact element, said second additional planar conductive element coupled to said second additional contact element and said RF amplifier stage, said contact means engaging said first and said second additional contact element when in the UHF reception position so as to couple said UHF tuner to said RF amplifier stage.

7. The combination as recited in claim 6 wherein the other of said wafers of said pair of tuning elements comprises a third additional planar conductive element and a third additional contact element corresponding to a UHF reception position, said second additional planar conductive element coupled to said second additional contact element and said RF input section, said contact means engaging said third additional contact element when in the UHF reception position so as to disable the RF input section.

8. The combination as recited in claim 7 wherein said one of said wafers of said other tuning element comprises a fourth additional planar conductive element and a fourth additional contact element corresponding to a UHF reception position, said fourth additional planar conductive element coupled to a power supply for said oscillator section, said fourth additional contact element coupled between said fourth additional planar conductive element and one of said plurality of contact elements, said contact means engaging said fourth additional contact element and said one of said plurality of contact elements in the UHF reception position so as to disconnect said oscillator section from the power supply.

9. The combination as recited in claim 8 wherein said plurality of planar conductive elements coat each of said dielectric members to form a continuum therewith and said support means comprises a printed circuit board.

References Cited

UNITED STATES PATENTS

| | | | |
|---|---|---|---|
| 2,789,212 | 4/1957 | Achenbach | 334—56 |
| 2,836,711 | 5/1958 | Krepps | 325—460 |
| 2,971,066 | 2/1961 | Tabet | 200—11D |
| 3,029,367 | 4/1962 | Tomonoh | 317—101C |
| 3,164,690 | 1/1965 | Heide | 200—11D |
| 3,242,433 | 3/1966 | Carlson | 325—461 |

ROBERT L. RICHARDSON, Primary Examiner

H. W. BRITTON, Assistant Examiner

U.S. Cl. X.R.

325—318, 453, 461, 462; 334—56